United States Patent [19]

Iranmanesh

[11] Patent Number: 5,587,613
[45] Date of Patent: Dec. 24, 1996

[54] LOW-CAPACITANCE, ISOTROPICALLY ETCHED ANTIFUSE AND METHOD OF MANUFACTURE THEREFOR

[75] Inventor: Ali Iranmanesh, Sunnyvale, Calif.

[73] Assignee: Crosspoint Solutions, Inc., Santa Clara, Calif.

[21] Appl. No.: 248,771

[22] Filed: May 25, 1994

[51] Int. Cl.$^6$ .................................................. H01L 29/00
[52] U.S. Cl. ............................................................ 257/530
[58] Field of Search ................................. 257/530, 531, 257/532

[56] References Cited

U.S. PATENT DOCUMENTS 5,451,810  9/1995  Tigelaar et al. ......................... 257/530

*Primary Examiner*—Mahshid Saadat
*Assistant Examiner*—S. V. Clark
*Attorney, Agent, or Firm*—Townsend and Townsend and Crew LLP

[57] ABSTRACT

The present invention provides for an integrated circuit antifuse structure having a first metal interconnection line, a programing layer over the first interconnection line, an etch stop layer over the programming layer, a sacrificial buffer layer over the etch stop layer, an insulating layer over the buffer layer, and a second metal interconnection line over the insulating layer. An aperture extends through the insulating layer and the buffer layer. The buffer layer has etching characteristics which are different from those of the insulating layer and the etch stop layer. This permits the aperture through the insulating layer to be formed with substantially vertical sides and through the buffer layer to be formed with substantially sloped sides. The second interconnection line extends into the aperture to form an antifuse structure with a low capacitance and a consistent programming voltage.

7 Claims, 4 Drawing Sheets

LOW-CAPACITANCE, ISOTROPICALLY ETCHED ANTIFUSE AND METHOD OF MANUFACTURE THEREFOR

BACKGROUND OF THE INVENTION

The present invention is related to Field Programmable Gate Array (FPGA) integrated circuits and, more particularly, to antifuses in FPGAs and their manufacture.

Antifuses are found in a growing number of integrated circuits, most of which are FPGAs. As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer of amorphous silicon is sandwiched between two metal interconnection lines. Depending upon the material of a metal interconnection line, a layer of barrier metal, such as TiW (titanium-tungsten), is used as an interfacing layer of the metal interconnection line to the programming layer. Barrier metal layers function to block the undesired interdiffusion of material from the programming layer, silicon from amorphous silicon, and material from a metal layer, aluminum from aluminum alloy, for instance. Barrier metal layers are typically refractory metals, their intermetallics, alloys, silicides, nitrides and combinations thereof.

An antifuse is programmed by placing a large voltage across the two metal interconnection lines. The programming voltage is much larger than the operating voltages in the FPGA and causes the programming layer to melt to form a conducting link between the two interconnection lines.

Nonetheless, various problems have been found with present day antifuses. One problem is that the programmed resistance ($R_{ON}$) of the antifuses of the FPGA tends to vary widely and unpredictably, even to the point that the antifuse can be considered unprogrammed. This is undesirable because the failure of one antifuse may remove the defined function of the programmed circuit in the FPGA and the unpredictability of the resistances of the programmed antifuses also renders the performance of the FPGA to be inconsistent.

Another problem, which is believed to be related to the first problem, is that voltages to program the antifuses also tend to vary widely. Circuit and process designs must be made to accommodate these variations, which adversely affect the cost and performance of the integrated circuit incorporating these antifuses.

The present invention solves or substantially mitigates these problems. An advantage of the present invention is that the resulting antifuse has a low capacitance which allows a high performance of the FPGA. A further advantage is that the present invention can be incorporated into existing antifuse processes without radical and expensive changes.

SUMMARY OF THE INVENTION

The present invention provides for an integrated circuit antifuse structure having a first metal interconnection line, a programming layer over the first interconnection line, an etch stop layer over the programming layer, a sacrificial buffer layer over the etch stop layer, an insulating layer over the buffer layer, and a second metal interconnection line over the insulating layer. The insulating layer is relatively thick with respect to the etch stop layer and has an aperture which extends through the insulating layer and the buffer layer. The aperture through the insulating layer has substantially vertical sides. Though the buffer layer the aperture has substantially sloped sides. The second interconnection line also extends into the aperture to form an antifuse structure with a low capacitance and a consistent programming voltage.

The present invention also provides for a method of forming an antifuse in an integrated circuit having a first insulating layer on a semiconductor substrate. The method includes the steps of forming a first metal interconnection layer on the first insulating layer; forming a programming layer over the first metal interconnection layer; forming a relatively thin etch stop layer over the programming layer; forming a sacrificial buffer layer over the etch stop insulating layer; forming a relatively thick, second insulating layer over the buffer layer, the buffer layer having different etching characteristics than the second insulating layer and the etch stop layer; etching a first aperture through the second insulating layer to the buffer layer; etching a second aperture with substantially sloping sides through the buffer layer in the first aperture; and forming a second metal interconnection layer on the second insulating layer and in first and second apertures. The second aperture is etched by isotropically etching the buffer layer without affecting the first aperture through the second insulating layer. This method forms antifuses between the first and second metal interconnection layers with low capacitance and consistent programming voltages.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENTS

At least one of the reasons for the variation in programmed resistance, $R_{ON}$, and programming voltages in present day antifuse structures is believed to be the irregularities in the programming layer between the two metal interconnection lines. For example, a protrusion into the programming layer by one of the interconnection lines creates a point of high electric fields during the programming of the antifuse. The likelihood of a breakdown of the programming layer at this location is high; however, process control over the thickness of the programming layer at this point is uncertain. Therefore, the conducting link formed at this location has an uncertain resistance and the programming voltage is uncertain. Likewise, there is a similar result if the programming layer is not formed evenly, such as the formation of folds in the programming layer. Ideally, the programming layer should have an even thickness. To achieve that end, the layer should have a flat, or at least a well-rounded, contour between the two metal interconnection lines. The present invention forms the programming layer with flat contours. Additionally the resulting antifuse structure has a small capacitance so that the unprogrammed antifuses do not hinder the performance of the FPGA unduly.

FIG. 1A–1E illustrate the process steps used to manufacture an antifuse structure according to one embodiment of the present invention. It should be understood that the described antifuse structure is formed between the metal interconnection lines of the integrated circuit. Thus, the described manufacturing steps are performed after the transistors and other circuit elements have been created in the semiconductor substrate of the integrated circuit.

Figure 1A:
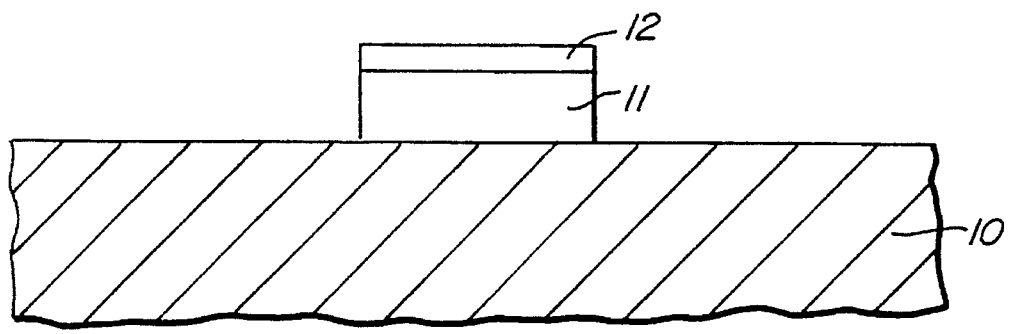
FIGS. 1A–1E illustrate a sequence of steps used to manufacture an antifuse structure according to one embodiment of the present invention.

FIG. 1A shows a first metal interconnection line formed by an aluminum layer 11 and barrier metal layer 12, which have been deposited and defined upon an insulating layer 10. As contemplated, the barrier metal layer 12 is formed from TiW, though other metals and materials may be used. The insulating layer 10 has been formed over the surface of the semiconductor substrate, not shown.

Figure 1B:
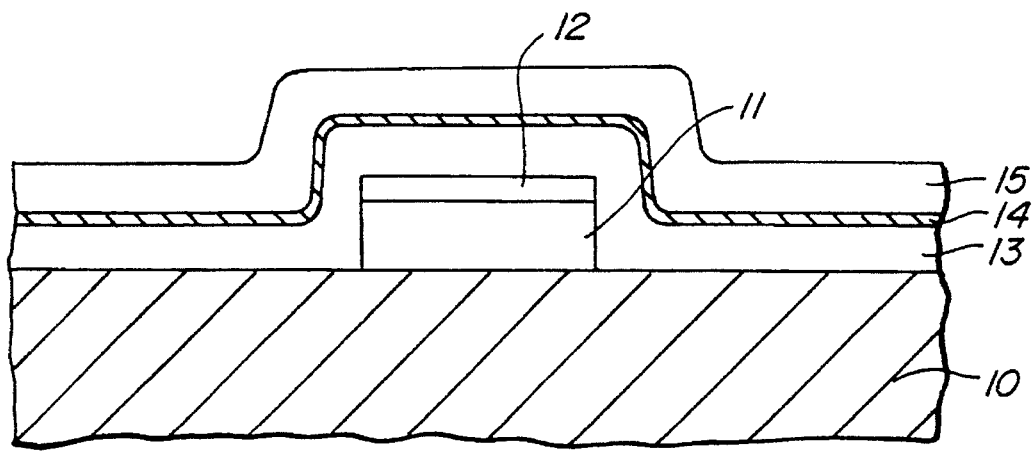

Then, over the insulating layer 10 and the first metal interconnection lines formed by the layers 11 and 12, an amorphous silicon layer 13 is deposited, as shown in FIG. 1B. The layer 13 forms the programming layer of the antifuse. The amorphous silicon layer 13 is formed by a plasma-enhanced chemical vapor deposition (PECVD) process to a thickness between 500–1000 Å, with 700 Å being considered optimum. The amorphous silicon of the layer 13 is also formed with 8–20% hydrogen by atomic weight. Over the layer 13, an etch-stop layer of silicon dioxide is formed to a thickness between 20–40Å, 30 Å being considered optimum. One method of forming the etch stop layer 14 is by exposing the amorphous silicon layer 13 to the ambient atmosphere and heating it. Other methods, such as deposition, are well-known to semiconductor process engineers and may be used as well.

Over the etch-stop layer 14, a buffer layer 15 of amorphous silicon is formed in the same manner as the layer 13. The amorphous silicon layer 15 is formed to a thickness between 300–800 Å thick. The buffer layer 15 has etching characteristics different from the insulating layer described immediately below. Hence, materials, such as silicon nitride, polysilicon, polygermanium, and even heavily doped silicon dioxide, may be used for the buffer layer 15, besides amorphous silicon.

Figure 1C:
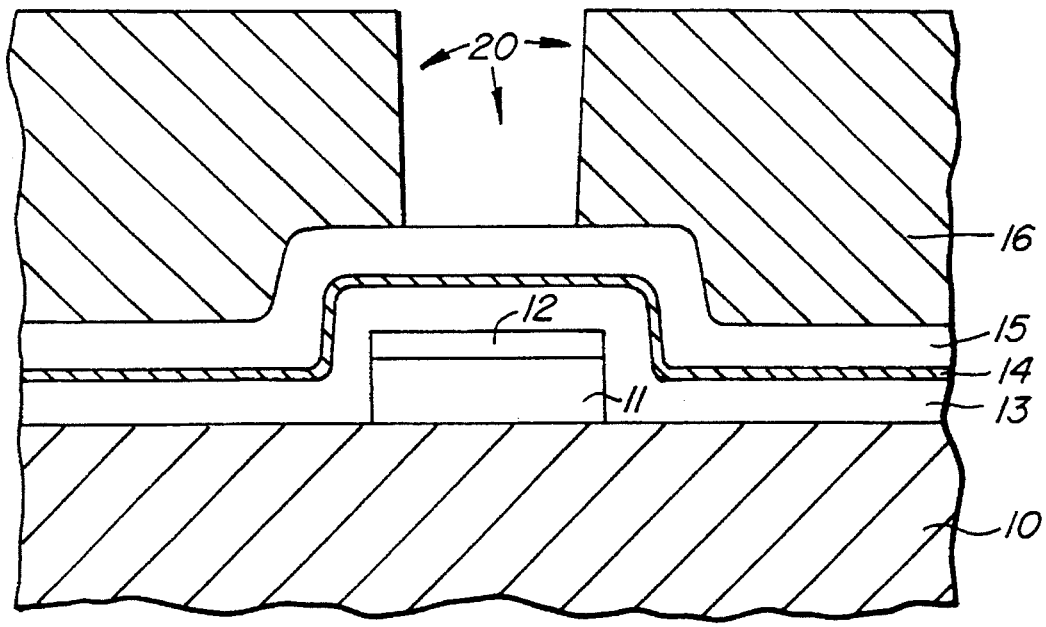

As shown in FIG. 1C, a thick insulating layer of silicon dioxide is formed over the amorphous silicon layer 15. The layer 16 forms the interlayer dielectric to a thickness between 5000–15,000 Å. Techniques to form interlayer dielectric layers are well-known. In the location where an antifuse is to be formed, an aperture 20 is created by standard photolithographic and dry etching techniques. The isotropic etching, forming substantially vertical sidewalls in the aperture 20, is specific to the silicon dioxide layer 16 and stops at the top surface of the amorphous silicon layer 15.

Figure 1D:
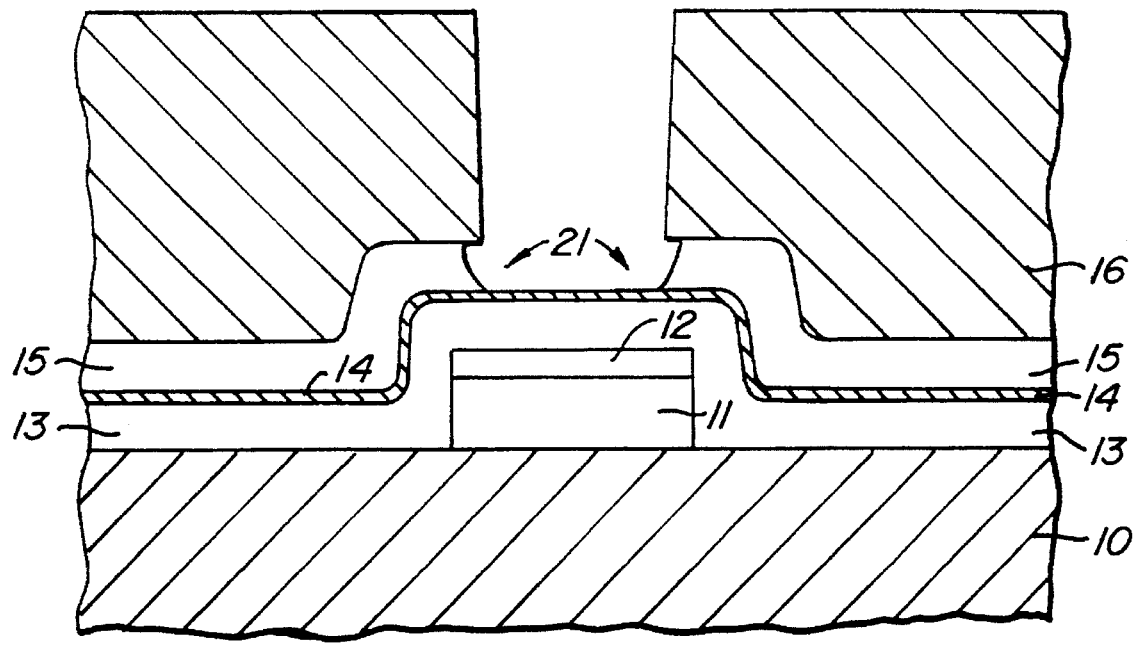

Then, an isotropic etching step is performed to open an aperture 21 through the amorphous silicon layer 15, as shown in FIG. 1D, without substantially affecting the aperture 20. This is possible since the buffer layer 15 has different etching characteristics than the silicon dioxide layer 16. Etching specific to amorphous silicon may be used for the aperture 21, while leaving the aperture 20 unaffected. The isotropic etching step may be performed by dry etching, with $Cl_2$ or $CCl_2F_2$ as etchants, for example. Alternatively, wet etching using chemicals, such as KOH, as etchants may also be used for this step. Such steps are well-known to semiconductor process engineers. The aperture 21 has sloping sidewalls formed by the layer 15, and some undercutting of the insulating layer 16. The etch-stop layer 14 being of silicon dioxide prevents the isotropic etch from proceeding any deeper and protects the amorphous silicon layer 13.

A barrier metal layer 18 of TiW is sputtered over the insulating layer 16 and into the apertures 20 and 21 to contact the exposed top surface of the etch-stop layer 14. $MoSi_2$, TiN and other materials may be used for the barrier metal. Alternatively, before the deposition of the barrier metal layer 18, the exposed portion of the etch-stop layer 14 may be removed by a quick etching operation using HF as an etchant. It should be noted that the etch-stop layer 14, if unremoved, prevents or lowers leakage currents in the unprogrammed antifuses. Over the barrier metal layer 18, an aluminum alloy layer 19 is deposited and the two layers 18 and 19 are defined by standard photolithographic and etching operations to define the second metal interconnection line.

Figure 1E:
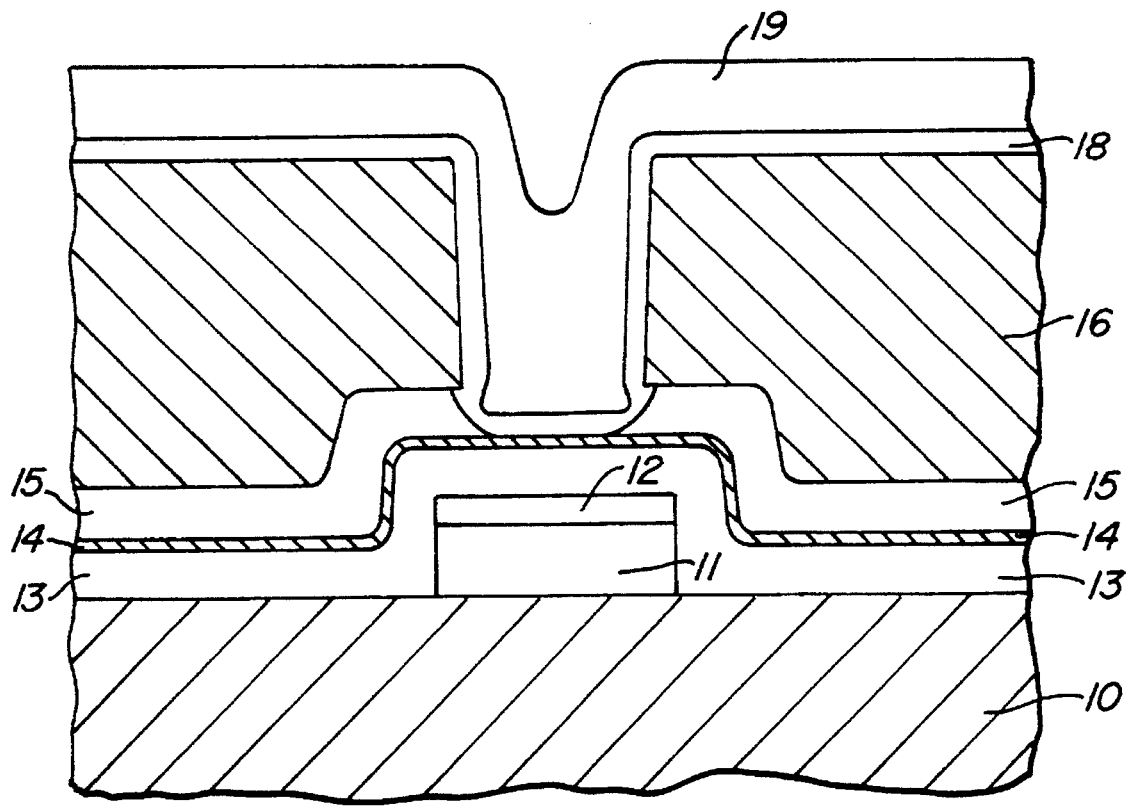

The completed antifuse structure is shown in FIG. 1E. (Not shown are the remaining structure, such as the passivating and bonding pad layers, to complete the integrated circuit.) The buffer layer 15 has been sacrificed to form sloping sides and a well-rounded contour for the second interconnection line in the antifuse structure The portion of the amorphous silicon layer 13 beneath the via 21 is flat. Hence, the antifuse structure has a programming layer which is uniform and flat. When programmed, the antifuse forms a conducting link in the region occupied by the flat layer 13, the thickness of which can be easily controlled. The uniformity of the thickness of the layer 13 allows for a more controlled programming voltage. Furthermore, the uniformity of the thickness of the amorphous silicon layer 13 between the first and second metal interconnection lines permits a more uniform programming voltage of the antifuse.

Another advantage of the disclosed structure is that of low capacitance. The two metal interconnection lines form two plates of the capacitor in an unprogrammed antifuse. The area exposed of the etch-stop layer 14 in the isotropic etch step defines most of the capacitive coupling of the antifuse. This area is small, and hence lowers the capacitive coupling of the unprogrammed antifuse which, in turn, lessens the RC time constants of the first and second metal interconnection lines.

Figure 2A:
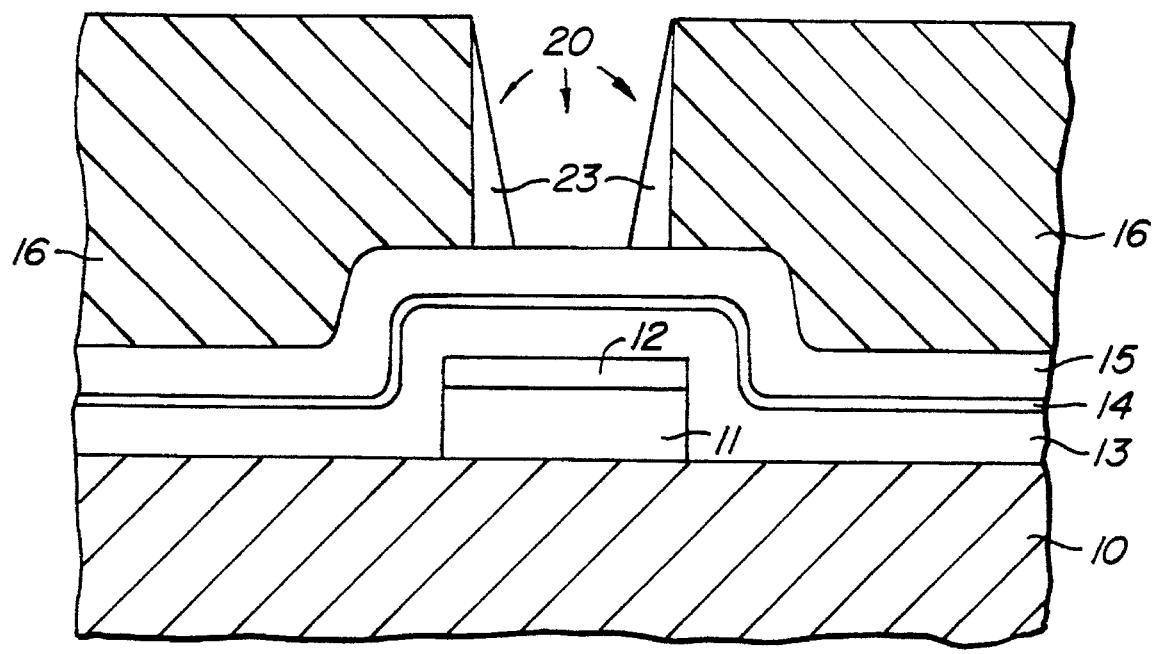
FIGS. 2A–2D illustrate a sequence of steps used to manufacture an antifuse structure according to an alternate embodiment of the present invention.

The antifuse structure, illustrated in FIG. 1E, has some undercutting of the interlayer dielectric 16. This may cause some problems in the conformal deposition of the barrier metal layer 18. To avoid this, the present invention offers an alternative embodiment which eliminates undercutting. The alternative embodiment starts at the process step illustrated by FIG. 1C, i.e., after the aperture 20 is formed through the insulating layer 16. As shown in FIG. 2A, spacers 23 are formed in the aperture 20. A layer of silicon dioxide, or alternatively, silicon nitride, is deposited over the layer 16 and into the aperture 20. Then by reactive ion etching, the deposited layer of silicon dioxide, or silicon nitride, is removed from the top surfaces of the insulating layer 16 and the buffer layer 15 in the aperture 20. Only spacer regions 23 formed along the sides of the aperture 20 remain.

Figure 2B:
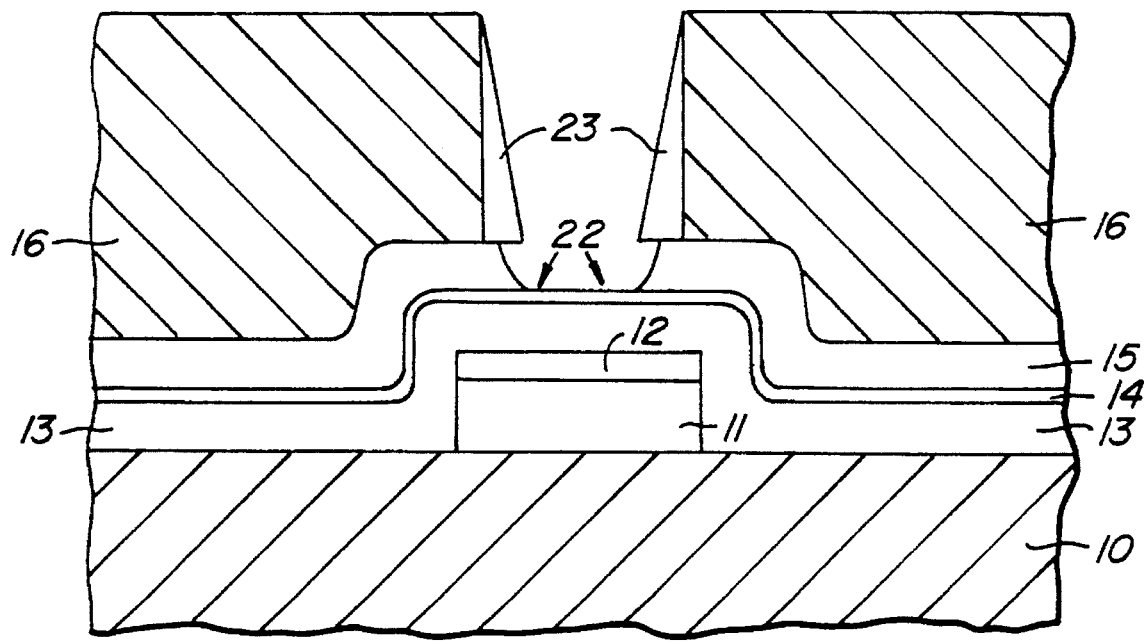

Then, using the spacer regions 23 as a mask, an isotropic etching operation is performed on the buffer layer 15, as shown in FIG. 2B. An aperture 22 is formed through the amorphous silicon layer 15. The etch-stop layer 14 performs the same function as described previously.

Figure 2C:
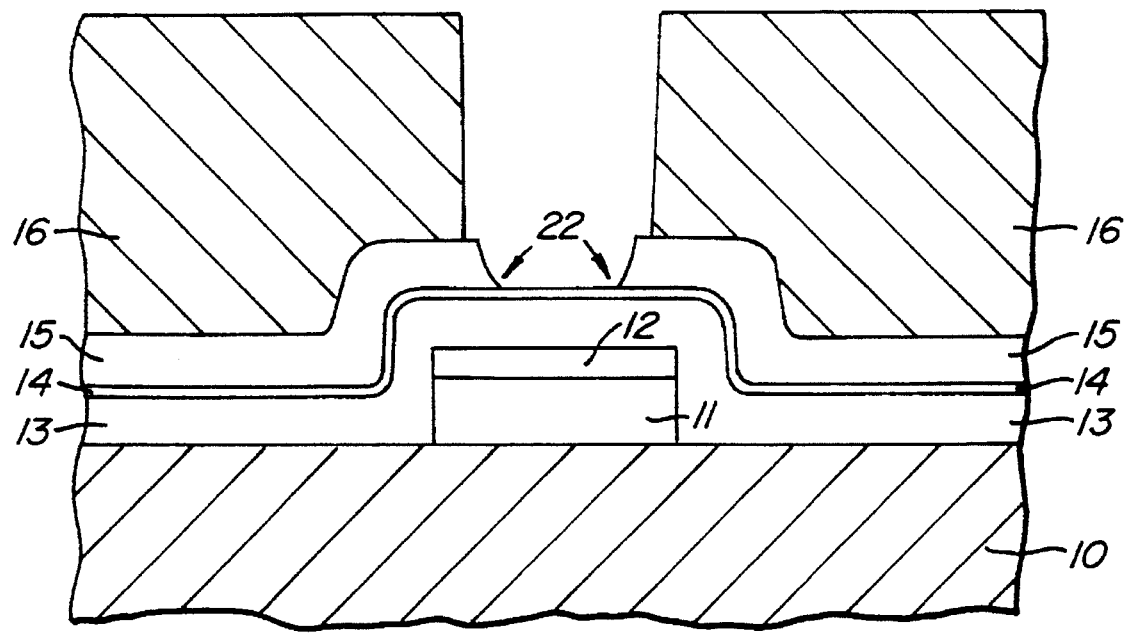

The spacer regions 23 are then removed, as shown in FIG. 2C, with an etchant, such as HF. The aperture 22 in the amorphous silicon layer 15 has rounded sidewalls, but there is no undercutting of the insulating layer 16. Then, as described previously, a barrier metal layer 28 of TiW and an aluminum alloy layer 29 are deposited and defined to form the second metal interconnection line.

Figure 2D:
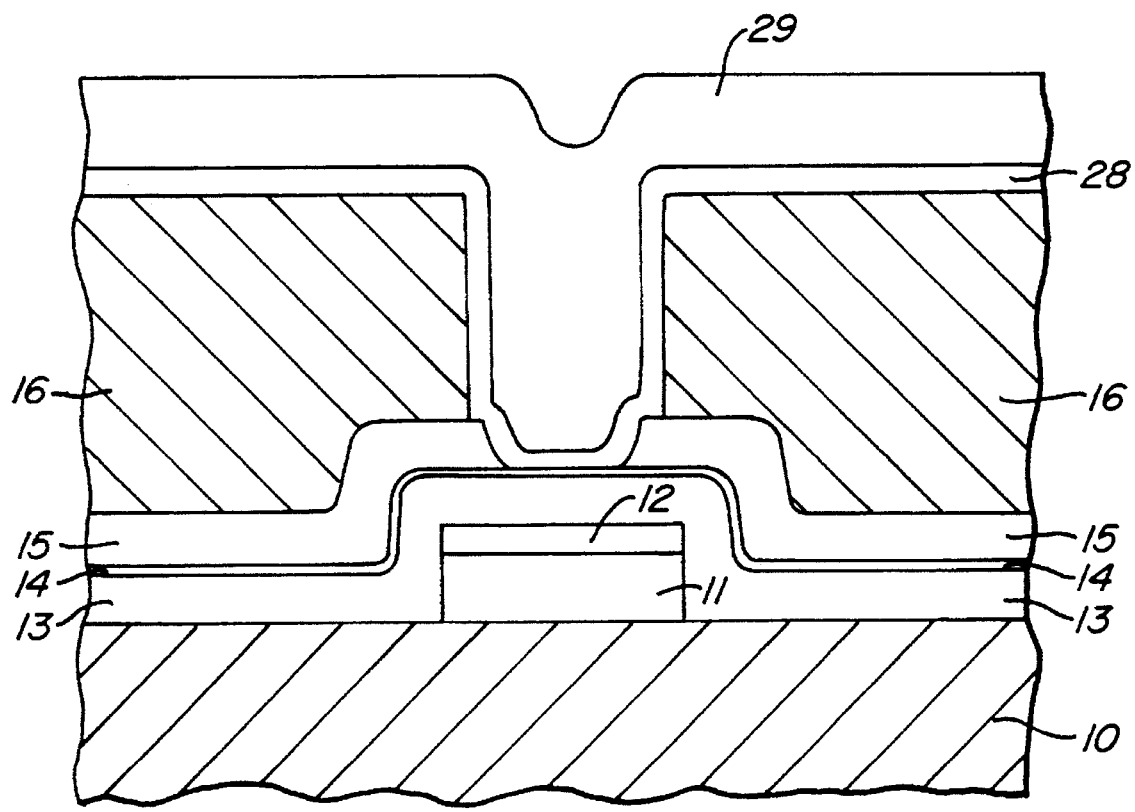

The antifuse structure shown in FIG. 2D has the advantages of the previously described antifuse structure without the disadvantage of an undercut of the insulating layer 16. Moreover, the capacitance of the structure is further reduced since the contact area of the second metal interconnection line to the top surface of the etch stop layer 14 (or the top surface of the programming layer 13, if the layer 14 is removed) is reduced, since the spacer regions 23 define the size of the aperture 22 and the contact area.

While the above is a complete description of the preferred embodiments of the invention, various alternatives, modifications and equivalents may be used. For example, while the layer 13 has been described as an amorphous silicon layer, other programming materials may be used for these layers. Additionally, other materials, such as MoSi and TiN, may be used for the barrier metal layers, besides TiW. It should be evident that the present invention is equally applicable by making appropriate modifications to the embodiments described above.

What is claimed is:

1. An antifuse structure in an integrated circuit comprising a first metal interconnection line;

a programming layer over said first interconnection line;

an etch stop layer over said programming layer, said etch stop layer from 20 to 40 Å thick;

a buffer layer over said etch step layer, said buffer from 300 to 800 Å thick;

an insulating layer over said buffer layer, said buffer layer having etching characteristics different from said insulating layer and said etch stop layer, said insulating layer being relatively thick with respect to said etch stop layer and having an aperture therethrough, said aperture further extending through said buffer layer, said insulating layer from 5000 to 15000 Å thick; and a second interconnection line over said insulating layer and in said aperture;

whereby said antifuse structure has low capacitance and a consistent programming voltage.

2. The antifuse structure of claim 1 wherein said aperture through said buffer layer has concave, sloped sidewalls.

3. The antifuse structure of claim 2 wherein said buffer layer comprises amorphous silicon.

4. The antifuse structure of claim 2 wherein said second metal interconnection line comprises an aluminum layer and a barrier metal layer between said aluminum layer and said programming layer.

5. The antifuse structure of claim 4 wherein said etch stop layer contacts said barrier metal layer and said programming layer.

6. The antifuse structure of claim 4 wherein said barrier metal layer contacts said programming layer.

7. The antifuse structure of claim 4 wherein said first metal interconnection line comprises an aluminum layer and a barrier metal layer between said aluminum layer and first programming-layer.

\* \* \* \* \*